(12) United States Patent
Saji et al.

(10) Patent No.: US 11,228,300 B2
(45) Date of Patent: Jan. 18, 2022

(54) ELASTIC WAVE DEVICE, HIGH-FREQUENCY FRONT-END CIRCUIT, AND COMMUNICATION APPARATUS

(71) Applicant: Murata Manufacturing Co., Ltd., Nagaokakyo (JP)

(72) Inventors: Mari Saji, Nagaokakyo (JP); Ryo Nakagawa, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 793 days.

(21) Appl. No.: 16/132,508

(22) Filed: Sep. 17, 2018

(65) Prior Publication Data
US 2019/0097604 A1 Mar. 28, 2019

(30) Foreign Application Priority Data
Sep. 27, 2017 (JP) .............................. JP2017-186001

(51) Int. Cl.
*H03H 9/02* (2006.01)
*H03H 9/25* (2006.01)
*H03H 9/145* (2006.01)

(52) U.S. Cl.
CPC .......... *H03H 9/25* (2013.01); *H03H 9/02559* (2013.01); *H03H 9/02574* (2013.01); *H03H 9/14541* (2013.01)

(58) Field of Classification Search
CPC ....................... H03H 9/02559; H03H 9/02574
USPC ...... 310/313 R, 313 A, 313 B, 313 C, 313 D
See application file for complete search history.

(56) References Cited

U.S. PATENT DOCUMENTS

| | | |
|---|---|---|
| 2009/0237181 A1 | 9/2009 | Kadota |
| 2013/0285768 A1 | 10/2013 | Watanabe et al. |
| 2018/0159497 A1 | 6/2018 | Iwamoto et al. |

FOREIGN PATENT DOCUMENTS

| | | |
|---|---|---|
| JP | 2015-073331 A | 4/2015 |
| WO | 2008/081695 A1 | 7/2008 |
| WO | 2017/043427 A1 | 3/2017 |

*Primary Examiner* — Derek J Rosenau
(74) *Attorney, Agent, or Firm* — Keating & Bennett, LLP

(57) ABSTRACT

An elastic wave device includes a piezoelectric layer, an IDT electrode on the piezoelectric layer, a high-acoustic-velocity member, a low-acoustic-velocity film between the high-acoustic-velocity member and the piezoelectric layer. The piezoelectric layer is made of lithium tantalate, the IDT electrode includes metal layers including an Al metal layer and a metal layer having a higher density than Al. Expression 1 is satisfied: $301.74667 - 10.83029 \times T_{LT} - 3.52155 \times T_{ELE} + 0.10788 \times T_{LT}^2 + 0.01003 \times T_{ELE}^2 + 0.03989 \times T_{LT} \times T_{ELE} \geq 0$ expression 1, where $\lambda$ represents a wavelength defined by an electrode finger pitch of the IDT electrode, $T_{LT}$ (%) represents a normalized film thickness of the piezoelectric layer to the wavelength $\lambda$, and $T_{ELE}$ (%) represents a normalized film thickness of the IDT electrode in terms of Al to the wavelength $\lambda$.

15 Claims, 9 Drawing Sheets

ELASTIC WAVE DEVICE, HIGH-FREQUENCY FRONT-END CIRCUIT, AND COMMUNICATION APPARATUS

CROSS REFERENCE TO RELATED APPLICATIONS

This application claims the benefit of priority to Japanese Patent Application No. 2017-186001 filed on Sep. 27, 2017. The entire contents of this application are hereby incorporated herein by reference.

BACKGROUND OF THE INVENTION

1. Field of the Invention

The present invention relates to an elastic wave device, a high-frequency front-end circuit, and a communication apparatus.

2. Description of the Related Art

Elastic wave devices have been widely used as, for example, filters of cellular phones. International Publication No. 2017/043427 discloses an elastic wave device having a structure in which a high-acoustic-velocity supporting substrate, a low acoustic-velocity film, and a piezoelectric film are stacked in this order. International Publication No. 2017/043427 states that the use of the piezoelectric film having a film thickness of about $3.5\lambda$ or less improves the quality factor.

However, studies by the inventors of preferred embodiments of the present invention have revealed that even if the piezoelectric film has a film thickness of about $3.5\lambda$ or less, the quality factor is degraded, in some cases.

SUMMARY OF THE INVENTION

Preferred embodiments of the present invention provide elastic wave devices each having a more reliably improved quality factor, high-frequency front-end circuits, and communication apparatuses.

According to a preferred embodiment of the present invention, an elastic wave device includes a piezoelectric layer, an interdigital transducer (IDT) electrode disposed on the piezoelectric layer, a high-acoustic-velocity member in which an acoustic velocity of a bulk wave that propagates through the high-acoustic-velocity member is higher than an acoustic velocity of an elastic wave that propagates through the piezoelectric layer, and a low-acoustic-velocity film in which an acoustic velocity of a bulk wave that propagates through the low-acoustic-velocity film is lower than an acoustic velocity of an elastic wave that propagates through the piezoelectric layer, the low-acoustic-velocity film being disposed between the high-acoustic-velocity member and the piezoelectric layer, in which the piezoelectric layer is made of lithium tantalate, the IDT electrode includes metal layers including an Al metal layer and a metal layer having a density higher than Al, and an expression 1 is satisfied:

$$301.74667 - 10.83029 \times T_{LT} - 3.52155 \times T_{ELE} + 0.10788 \times T_{LT}^2 + 0.01003 \times T_{ELE}^2 + 0.03989 \times T_{LT} \times T_{ELE} \geq 0 \quad \text{expression 1}$$

where $\lambda$ represents a wavelength defined by an electrode finger pitch of the IDT electrode, $T_{LT}$ (%) represents a normalized film thickness of the piezoelectric layer and is obtained by normalizing a film thickness of the piezoelectric layer to the wavelength $\lambda$, and $T_{ELE}$ (%) represents a normalized film thickness of the IDT electrode in terms of Al and is obtained by normalizing a film thickness of the IDT electrode in terms of Al to the wavelength $\lambda$, the film thickness of the IDT electrode in terms of Al being calculated by dividing a sum of products of densities and thicknesses of the respective metal layers by a density of Al.

In an elastic wave device according to a preferred embodiment of the present invention, an expression 2 may be satisfied:

$$236.606677 - 10.69079 \times T_{LT} - 3.52155 \times T_{ELE} + 0.10788 \times T_{LT}^2 + 0.01003 \times T_{ELE}^2 + 0.03989 \times T_{LT} \times T_{ELE} \geq 0 \quad \text{expression 2.}$$

In this case, the quality factor is able to be further and more reliably improved.

In an elastic wave device according to a preferred embodiment of the present invention, the normalized film thickness $T_{ELE}$ of the IDT electrode in terms of Al may be about 14% or more and about 24% or less. In this case, the elastic wave device is able to easily cope with high frequencies, and the quality factor is able to be further improved.

In an elastic wave device according to a preferred embodiment of the present invention, the high-acoustic-velocity member may be a supporting substrate.

An elastic wave device according to a preferred embodiment of the present invention may further include a supporting substrate, in which the high-acoustic-velocity member may be a high-acoustic-velocity film disposed between the supporting substrate and the low-acoustic-velocity film.

A high-frequency front-end circuit according to a preferred embodiment of the present invention includes an elastic wave device according to a preferred embodiment of the present invention and a power amplifier.

A communication apparatus according to a preferred embodiment of the present invention includes a high-frequency front-end circuit according to a preferred embodiment of the present invention and an RF signal processing circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments according to the present invention will be described below with reference to the attached drawings so as to clarify the present invention.

Preferred embodiments described herein are illustrative. It should be noted that partial replacement and combination of configurations in different preferred embodiments may be made.

Figure 1:
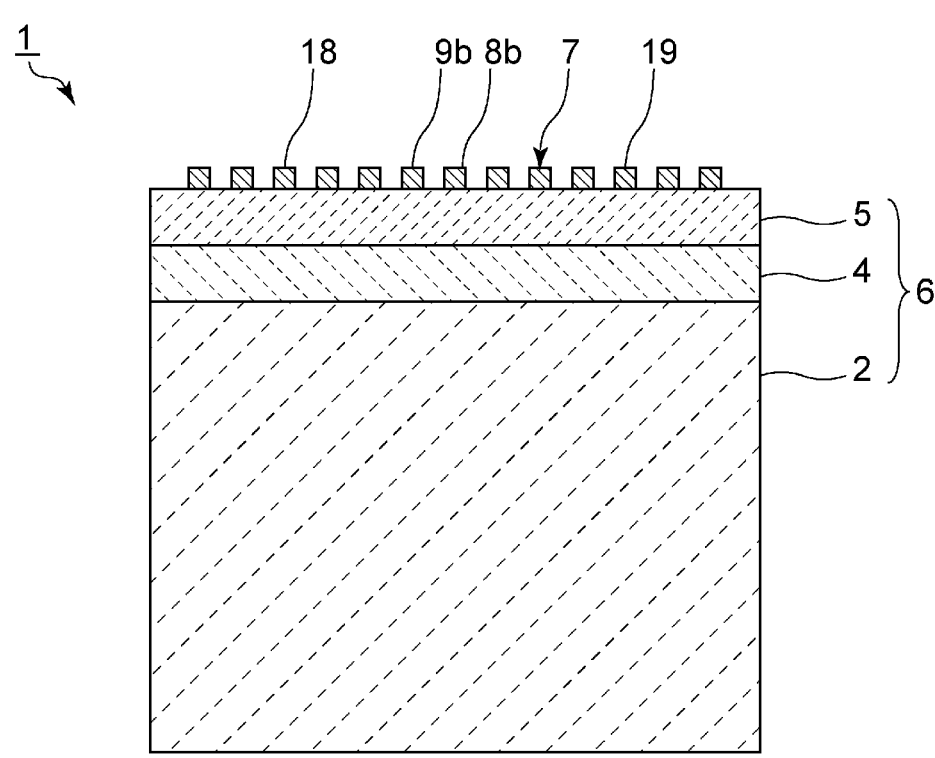
FIG. 1 is a front sectional view of an elastic wave device according to a first preferred embodiment of the present invention.

FIG. 1 is a front sectional view of an elastic wave device according to a first preferred embodiment of the present invention.

An elastic wave device 1 includes a supporting substrate 2. A low-acoustic-velocity film 4 is disposed on the supporting substrate 2. A piezoelectric layer 5 is disposed on the low-acoustic-velocity film 4. The piezoelectric layer 5 is preferably made of $LiTaO_3$, for example. An IDT electrode 7 is disposed on the piezoelectric layer 5.

A close contact layer preferably made of, for example, titanium or nickel may be disposed between the piezoelectric layer 5 and the low-acoustic-velocity film 4 and/or between the low-acoustic-velocity film 4 and the supporting substrate 2. A joining layer preferably made of, for example, titanium or nickel may be disposed between sublayers in the low-acoustic-velocity film 4. The low-acoustic-velocity film 4 may have a multilayer structure including low-acoustic-velocity materials.

The application of an alternating voltage to the IDT electrode 7 excites elastic waves. The low-acoustic-velocity film 4 is a film in which the acoustic velocity of a bulk wave that propagates through the low-acoustic-velocity film 4 is lower than the acoustic velocity of an elastic wave that propagates through the piezoelectric layer 5. The low-acoustic-velocity film 4 is preferably made of silicon oxide, for example. Silicon oxide is denoted as $SiO_x$. In the present preferred embodiment, the low-acoustic-velocity film 4 is preferably made of $SiO_2$, for example. The low-acoustic-velocity film 4 may be made of silicon oxide $SiO_x$ where x is an integer or is not an integer. The low-acoustic-velocity film 4 may be made of, for example, a glass, silicon oxynitride, tantalum oxide, or a material primarily including a compound in which fluorine, carbon, born is added to silicon oxide. Any material may be used for the low-acoustic-velocity film 4 as long as the acoustic velocity in it is relatively lower than that in a high-acoustic-velocity member described below.

In the present preferred embodiment, the supporting substrate 2 is the high-acoustic-velocity member in which the acoustic velocity of a bulk wave that propagates therethrough is higher than the acoustic velocity of an elastic wave that propagates through the piezoelectric layer 5. The high-acoustic-velocity member is preferably made of, for example, aluminum nitride, aluminum oxide, silicon carbide, silicon nitride, silicon oxynitride, silicon, sapphire, a piezoelectric material such as lithium tantalate, lithium niobate, or quartz crystal, a ceramic material such as alumina, zirconia, cordierite, mullite, steatite, or forsterite, diamond, magnesia, a diamond-like carbon (DLC) film, a material mainly including any of the foregoing materials, or a material mainly including any of mixtures of the foregoing materials. Any material may be used for the high-acoustic-velocity member as long as the acoustic velocity in it is relatively higher than that in the low-acoustic-velocity film 4.

The elastic wave device 1 includes a multilayer body 6 including the supporting substrate 2 defining and functioning as a high-acoustic-velocity member, the low-acoustic-velocity film 4, and the piezoelectric layer 5 stacked in this order. This results in a high quality factor and the effective confinement of elastic-wave energy to the piezoelectric layer 5 side.

Figure 2:
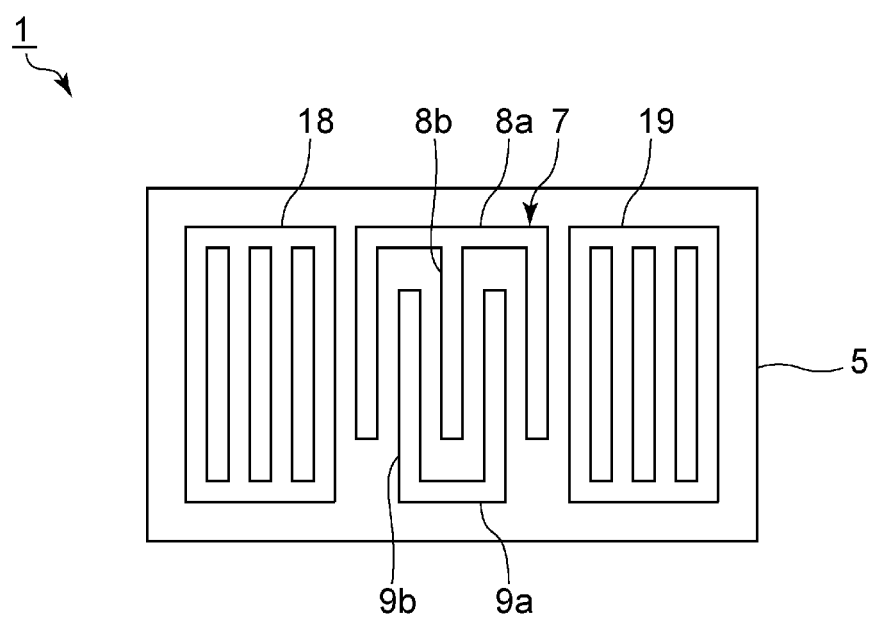
FIG. 2 is a plan view of the elastic wave device according to the first preferred embodiment of the present invention.

FIG. 2 is a plan view of the elastic wave device according to the first preferred embodiment.

Reflectors 18 and 19 are disposed on the respective sides of the IDT electrode 7 in an elastic wave propagation direction. The elastic wave device 1 is preferably a one-port elastic wave resonator, for example. The elastic wave device 1 is not limited to an elastic wave resonator.

The IDT electrode 7 includes a first busbar 8a and a second busbar 9a facing each other. The IDT electrode 7 includes first electrode fingers 8b each including an end connected to the first busbar 8a. The IDT electrode 7 includes second electrode fingers 9b each including an end connected to the second busbar 9a. The first electrode fingers 8b are interdigitated with the second electrode fingers 9b.

Figure 3:
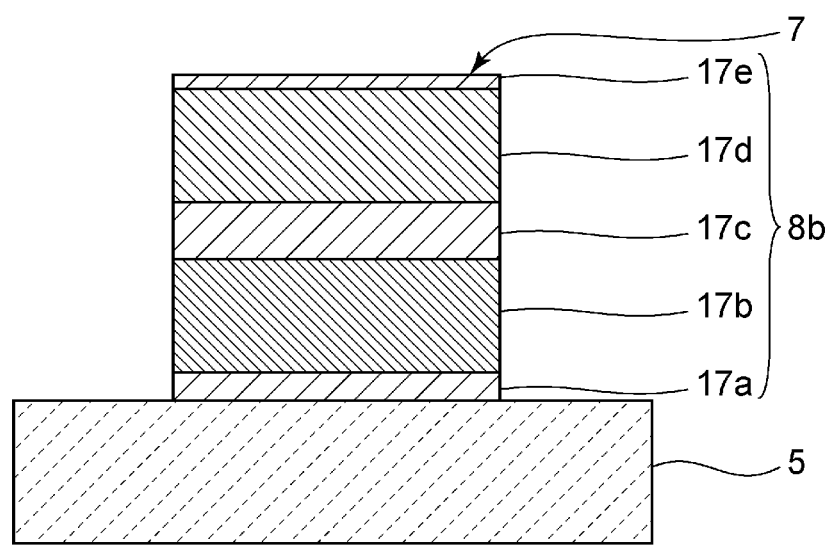
FIG. 3 is a front sectional view of a first electrode finger of an IDT electrode according to the first preferred embodiment of the present invention.

FIG. 3 is a front sectional view of the first electrode fingers of the IDT electrode according to the first preferred embodiment.

The IDT electrode 7 includes a metal film stack in which a first metal layer 17a, a second metal layer 17b, a third metal layer 17c, a fourth metal layer 17d, and a fifth metal layer 17e are stacked, in this order, on the piezoelectric layer 5. Specifically, the first metal layer 17a is preferably a Ti (titanium) layer, for example. The second metal layer 17b is preferably a Pt (platinum) layer, for example. The third metal layer 17c is preferably a Ti layer, for example. The fourth metal layer 17d is an Al (aluminum) layer. The fifth metal layer 17e is preferably a Ti layer, for example. The IDT electrode 7 includes the Al layer and thus has a low electrical resistance. Furthermore, the IDT electrode 7 includes the layer of Pt, which is a metal having a higher density than Al, and thus, has high mass without using an excessive large film thickness of the IDT electrode 7, thus resulting in an appropriately improved quality factor.

The metal layers of the IDT electrode 7 may include the Al metal layer and a metal layer having a higher density than at least one Al layer. The IDT electrode 7 may have a higher average density than Al.

In the present preferred embodiment, the second metal layer 17b, which is the Pt layer, and the fourth metal layer 17d, which is the Al layer, define and function as main electrode layers of the IDT electrode 7. The main electrode layers used in this specification refer to metal layers that dominate the excitation of elastic waves.

A value obtained by dividing a product of the density of the first metal layer 17a and a film thickness of the first metal layer 17a by a density of Al is defined as the film thickness of the first metal layer 17a in terms of Al. The film thickness of the IDT electrode 7 in terms of Al is defined as a sum of the film thicknesses of the first metal layer 17a, the second metal layer 17b, the third metal layer 17c, the fourth metal layer 17d, and the fifth metal layer 17e in terms of Al. A wavelength defined by the electrode finger pitch of the IDT electrode 7 is denoted by λ. The normalized film thickness of the IDT electrode 7 in terms of Al obtained by normalizing the film thickness of the IDT electrode 7 in terms of Al to the wavelength λ is denoted by $T_{ELE}$ (%). The normalized film thickness of the piezoelectric layer 5 obtained by normalizing the film thickness of the piezoelectric layer 5 to the wavelength λ is denoted by $T_{LT}$ (%).

In the present preferred embodiment, the elastic wave device includes the piezoelectric layer 5, the IDT electrode 7 disposed on the piezoelectric layer 5, the high-acoustic-velocity member in which the acoustic velocity of a bulk wave that propagates therethrough is higher than the acoustic velocity of an elastic wave that propagates through the piezoelectric layer 5, and the low-acoustic-velocity film 4 in which the acoustic velocity of a bulk wave that propagates therethrough is lower than the acoustic velocity of an elastic wave that propagates through the piezoelectric layer 5, the low-acoustic-velocity film 4 being disposed between the high-acoustic-velocity member and the piezoelectric layer 5, in which the piezoelectric layer 5 is made of lithium tantalate, the IDT electrode 7 includes the metal layers, the metal layers include the Al metal layer and the metal layer having a density higher than Al, and expression 1 below is satisfied. Thus, the quality factor is more reliably improved.

$$301.74667 - 10.83029 \times T_{LT} - 3.52155 \times T_{ELE} + 0.10788 \times T_{LT}^2 + 0.01003 \times T_{ELE}^2 + 0.03989 \times T_{LT} \times T_{ELE} \geq 0 \quad \text{expression 1}$$

The fact that the quality factor is more reliably improved when expression 1 is satisfied will be described below.

Examples of elastic wave devices having the structure according to the first preferred embodiment and including the second metal layers, which were the Pt layers, with different film thicknesses were produced. Furthermore, examples of elastic wave devices that included the second metal layers with different film thicknesses and that were used for different wavelengths λ were produced. Examples of elastic wave devices having the same or substantially the same structure as in the first preferred embodiment were similarly produced, except that expression 1 was not satisfied. Conditions, including the thicknesses of the second metal layers and the wavelengths λ, of these elastic wave devices were described below.

Piezoelectric layer, material: LiTaO₃, film thickness: about 600 nm

Low-acoustic-velocity film, material: SiO₂, film thickness: about 673 nm

First metal layer of IDT electrode, material: Ti, film thickness: about 12 nm

Figure 4:
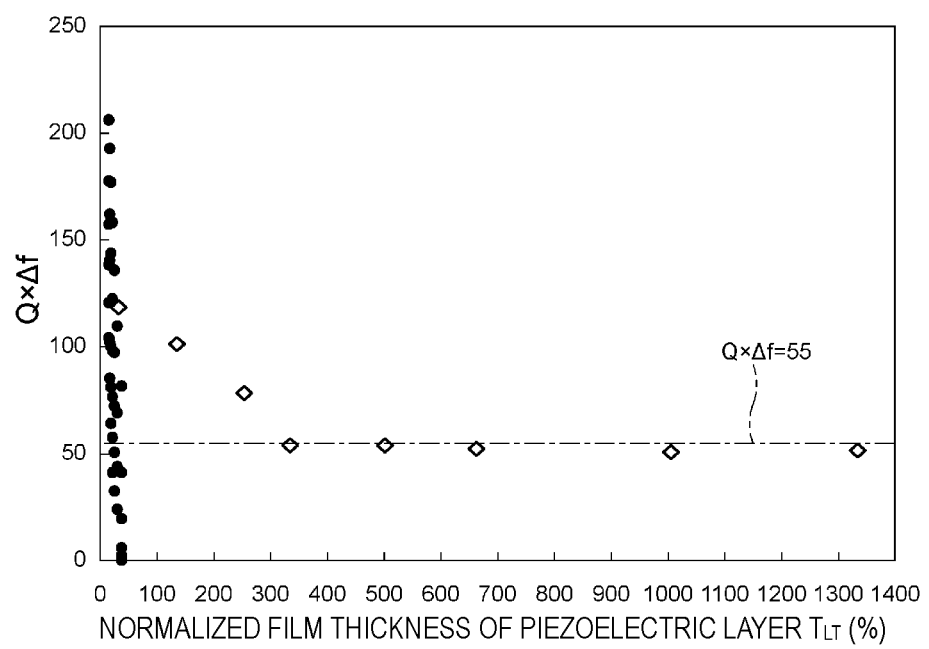
FIG. 4 is a graph illustrating the relationship between the normalized film thickness $T_{LT}$ of a piezoelectric layer and $Q \times \Delta f$.

Second metal layer of IDT electrode, material: Pt, film thickness: about 40 nm, about 80 nm, about 120 nm, about 160 nm, and about 200 nm Third metal layer of IDT electrode, material: Ti, film thickness: about 60 nm Fourth metal layer of IDT electrode, material: Al, film thickness: about 145 nm Fifth metal layer of IDT electrode, material: Ti, film thickness: about 4 nm Wavelength λ: about 1.6 μm, about 2 μm, about 2.4 μm, about 2.8 μm, about 3.2 μm, about 3.6 μm, and about 4 μm As with the foregoing examples of elastic wave devices, other examples of elastic wave devices for different wavelengths λ were similarly produced, except that the elastic wave devices did not include the second metal layer. The examples of elastic wave devices for different wavelengths λ include the piezoelectric layers with different normalized film thicknesses $T_{LT}$. Then Q×Δf of each of the resulting elastic wave devices was measured, where Δf represents the band width ratio of each elastic wave device. FIG. 4 illustrates the results, along with the results of examples of the related art.

FIG. 4 is a graph illustrating the relationship between the normalized film thickness $T_{LT}$ of the piezoelectric layer and Q×Δf. In FIG. 4, circles denote the foregoing measurement results, and rhombuses denote the results of examples of the related art.

FIG. 4 reveals that in the examples of the related art, when the normalized film thickness $T_{LT}$ of the piezoelectric layer is about 350% or less, Q×Δf is about 55 or more, which indicates a good quality factor. However, as illustrated in the measurement results, even if the normalized film thickness $T_{LT}$ of the piezoelectric layer is about 350% or less, Q×Δf is less than about 55, in some cases.

Based on the measurement results, multiple regression analysis was performed using the normalized film thickness $T_{LT}$ of the piezoelectric layer and the normalized film thickness $T_{ELE}$ of the IDT electrode in terms of Al. This leads to the following expression:

$$Q \times \Delta f = 356.74667 - 10.83029 \times T_{LT} - 3.52155 \times T_{ELE} + 0.10788 \times T_{LT}^2 + 0.01003 \times T_{ELE}^2 + 0.03989 \times T_{LT} \times T_{ELE}$$

When Q×Δf in this expression is about 55 or more, the quality factor is more reliably improved. This condition is represented by the following expression:

$$356.74667 - 10.83029 \times T_{LT} - 3.5155 \times T_{ELE} + 0.10788 \times T_{LT}^2 + 0.01003 \times T_{ELE}^2 + 0.03989 \times T_{LT} \times T_{ELE} \geq 55$$

Expression 1 described above is derived from this expression.

$$301.74667 - 10.83029 \times T_{LT} - 3.52155 \times T_{ELE} + 0.10788 \times T_{LT}^2 + 0.01003 \times T_{ELE}^2 + 0.03989 \times T_{LT} \times T_{ELE} \geq 0 \quad \text{expression 1}$$

Accordingly, it is possible to more reliably improve the quality factor by satisfying expression 1.

Expression 2 described below is preferably satisfied. In this case, the quality factor is further and more reliably improved.

$$236.606677 - 10.69079 \times T_{LT} - 3.52155 \times T_{ELE} + 0.10788 \times T_{LT}^2 + 0.01003 \times T_{ELE}^2 + 0.03989 \times T_{LT} \times T_{ELE} \geq 0 \quad \text{expression 2}$$

This will be described below.

Figure 5:
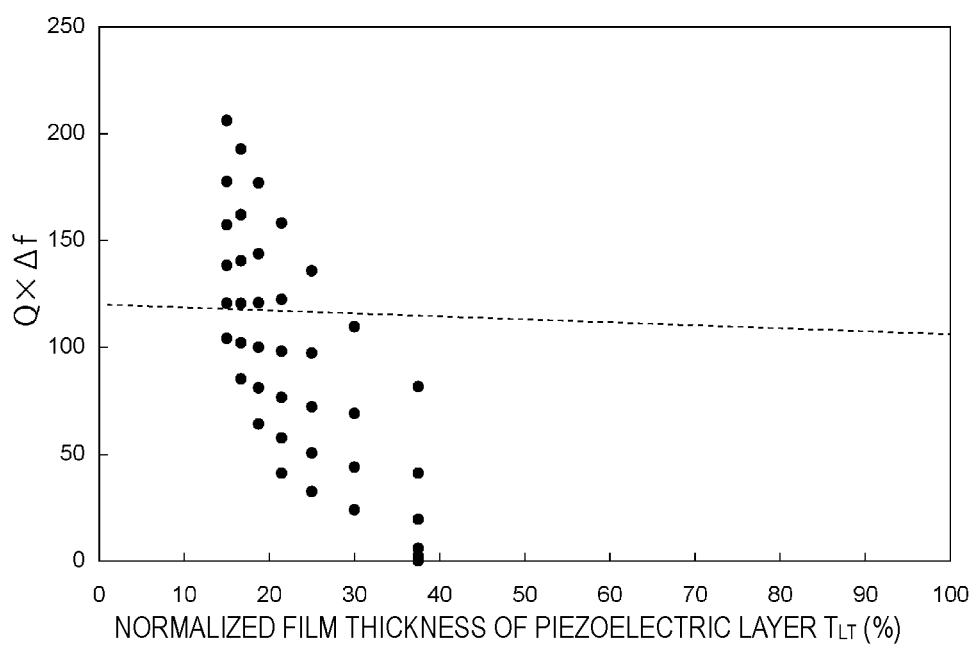
FIG. 5 is a graph illustrating the relationship between the normalized film thickness $T_{LT}$ of the piezoelectric layer and $Q \times \Delta f$.

FIG. 5 is a graph illustrating the relationship between the normalized film thickness $T_{LT}$ of the piezoelectric layer and Q×Δf. In FIG. 5, circles denote the foregoing measurement results plotted in FIG. 4. A broken line drawn in FIG. 5 indicates a line represented by the relational expression of the normalized film thickness $T_{LT}$ of the piezoelectric layer and Q×Δf, the relational expression being determined from the results of the examples of the related art presented in FIG. 4.

In the examples of the related art, when the normalized film thickness $T_{LT}$ of the piezoelectric layer is about 350% or less, the results are represented by the following expression:

$$Q \times \Delta f = -0.1395 \times T_{LT} + 120.14$$

When the value of Q×Δf obtained by performing the multiple regression analysis is equal to or larger than the value of Q×Δf in the examples of the related art, the quality factor is further improved. This condition is represented by the following expression:

$$356.74667 - 10.83029 \times T_{LT} - 3.52155 \times T_{ELE} + 0.10788 \times T_{LT}^2 + 0.01003 \times T_{ELE}^2 + 0.03989 \times T_{LT} \times T_{ELE} \geq -0.1395 \times T_{LT} + 120.14$$

Expression 2 described above is derived from this expression.

$$236.606677 - 10.69079 \times T_{LT} - 3.52155 \times T_{ELE} + 0.10788 \times T_{LT}^2 + 0.01003 \times T_{ELE}^2 + 0.03989 \times T_{LT} \times T_{ELE} \geq 0 \quad \text{expression 2}$$

Accordingly, it is possible to further and more reliably improve the quality factor by satisfying expression 2.

The normalized film thickness $T_{ELE}$ of the IDT electrode in terms of Al is preferably about 14% or more and about 24% or less, for example. In this case, the elastic wave device easily copes with high frequencies, and the quality factor is further improved. This will be described below.

Figure 6:
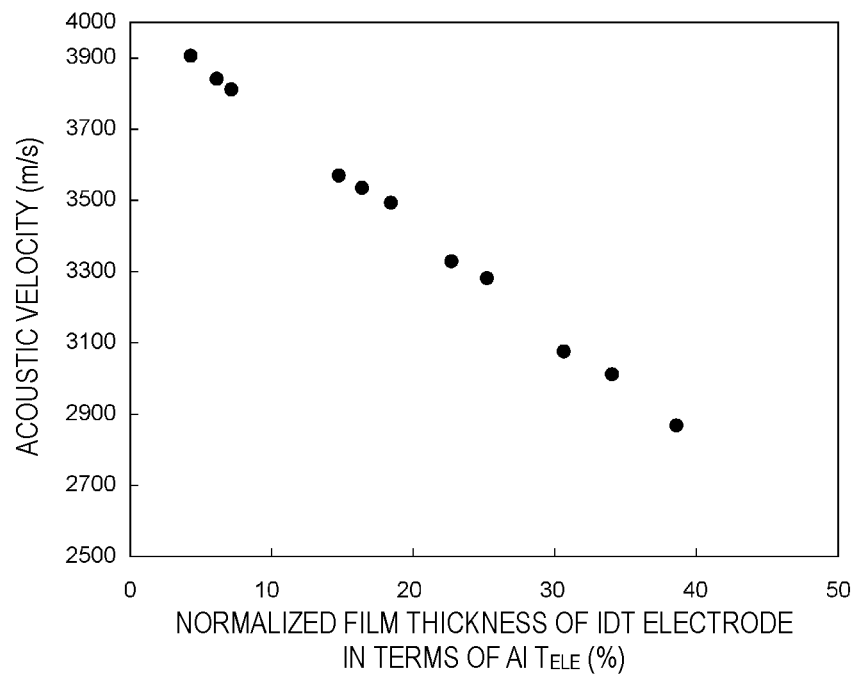
FIG. 6 is a graph illustrating the relationship between the normalized film thickness $T_{ELE}$ of the IDT electrode in terms of Al and the acoustic velocity.
Figure 7:
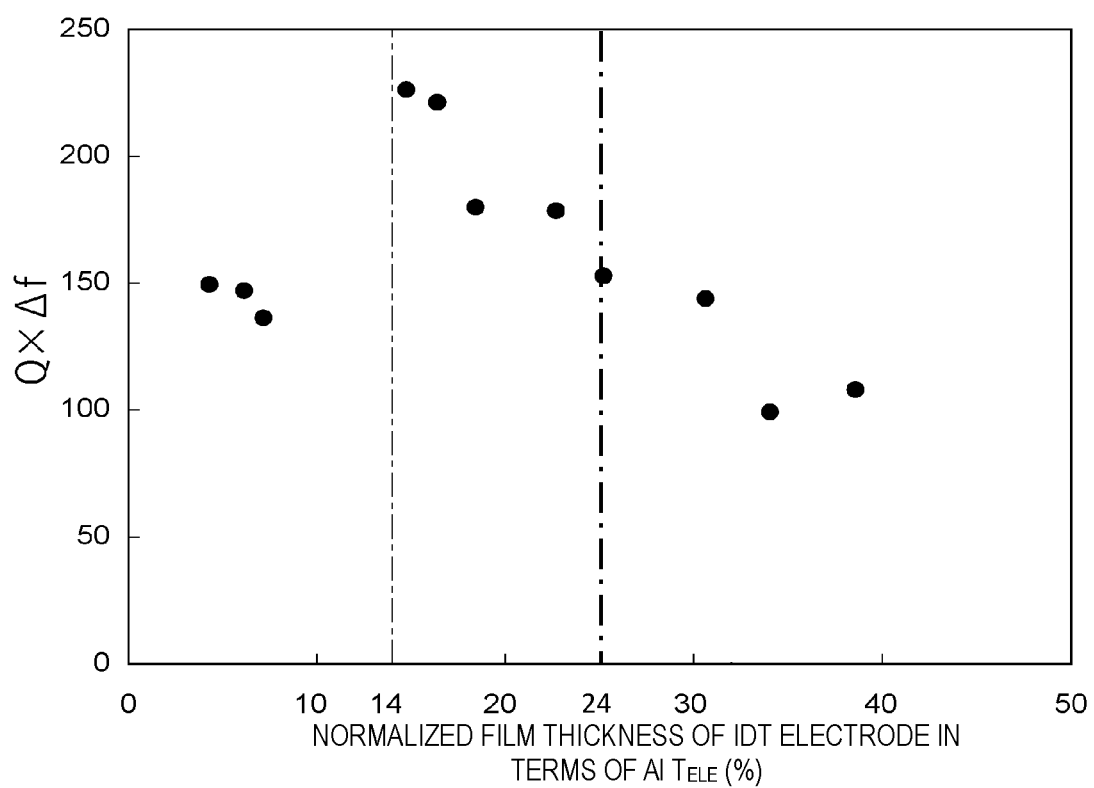
FIG. 7 is a graph illustrating the relationship between the normalized film thickness $T_{ELE}$ of the IDT electrode in terms of Al and $Q \times \Delta f$.

Examples of elastic wave devices having the same or substantially the same structure as in the first preferred embodiment and having different normalized film thicknesses $T_{ELE}$ of the IDT electrodes in terms of Al were produced. Then the relationships between the normalized film thickness $T_{ELE}$ of the IDT electrode in terms of Al and the acoustic velocity and between the normalized film thickness $T_{ELE}$ of the IDT electrode in terms of Al and Q×Δf were determined. FIGS. 6 and 7 illustrate the results.

FIG. 6 is a graph illustrating the relationship between the normalized film thickness $T_{ELE}$ of the IDT electrode in terms of Al and the acoustic velocity. FIG. 7 is a graph illustrating the relationship between the normalized film thickness $T_{ELE}$ of the IDT electrode in terms of Al and Q×Δf.

FIG. 6 indicates that a thinner normalized film thickness $T_{ELE}$ of the IDT electrode in terms of Al results in a higher acoustic velocity. Thus, when the IDT electrode has a thinner normalized film thickness $T_{ELE}$ in terms of Al, the elastic wave device easily copes with high frequencies. FIG. 7 indicates that when the normalized film thickness $T_{ELE}$ of the IDT electrode in terms of Al is about 14% or more and about 24% or less, the elastic wave devices have further improved quality factors. Accordingly, by setting the normalized film thickness $T_{ELE}$ of the IDT electrode in terms of Al to about 14% or more and about 24% or less, the elastic wave device easily copes with high frequencies and have a further improved quality factor.

Figure 8:
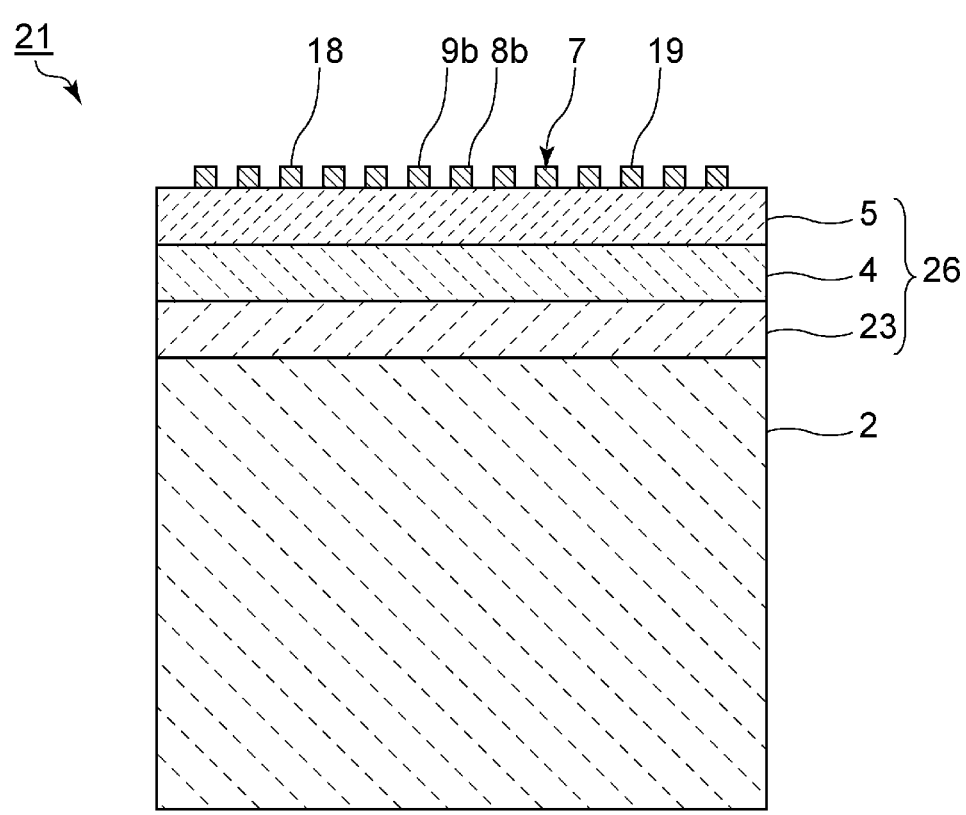
FIG. 8 is a front sectional view of an elastic wave device according to a second preferred embodiment of the present invention.

FIG. 8 is a front sectional view of an elastic wave device according to a second preferred embodiment of the present invention.

The elastic wave device according to the second preferred embodiment differs from that according to the first preferred embodiment in that a high-acoustic-velocity film 23 defining and functioning as a high-acoustic-velocity member is disposed between the supporting substrate 2 and the low-acoustic-velocity film 4. The same material as that of the supporting substrate 2 defining and functioning as the high-acoustic-velocity member according to the first preferred embodiment may preferably be used for the high-acoustic-velocity film 23. An elastic wave device 21 has the same or substantially the same structure as the elastic wave device 1 according to the first preferred embodiment, except for the foregoing aspects. In the present preferred embodiment, the supporting substrate 2 may be made of an appropriate material other than the material used for the high-acoustic-velocity member. The supporting substrate 2 is preferably made of, for example, piezoelectric material, such as aluminum nitride, aluminum oxide, silicon carbide, silicon nitride, silicon oxynitride, silicon, sapphire, lithium tantalate, lithium niobate, or quartz crystal, a ceramic material such as alumina, zirconia, cordierite, mullite, steatite, or forsterite, diamond, magnesia, a material primarily including any of the foregoing materials, or a material primarily including any of mixtures of the foregoing materials.

The elastic wave device 21 includes a multilayer body 26 including the high-acoustic-velocity film 23, the low-acoustic-velocity film 4, and the piezoelectric layer 5 stacked in this order. This results in a high quality factor and the effective confinement of elastic-wave energy to the piezoelectric layer 5 side. As with the first preferred embodiment, expression 1 is also satisfied in the present preferred embodiment; thus, the quality factor is more reliably improved.

The elastic wave devices according to the foregoing preferred embodiments may be used for, for example, duplexers of in high-frequency front-end circuits. The preferred embodiments will be described in more detail below.

Figure 9:
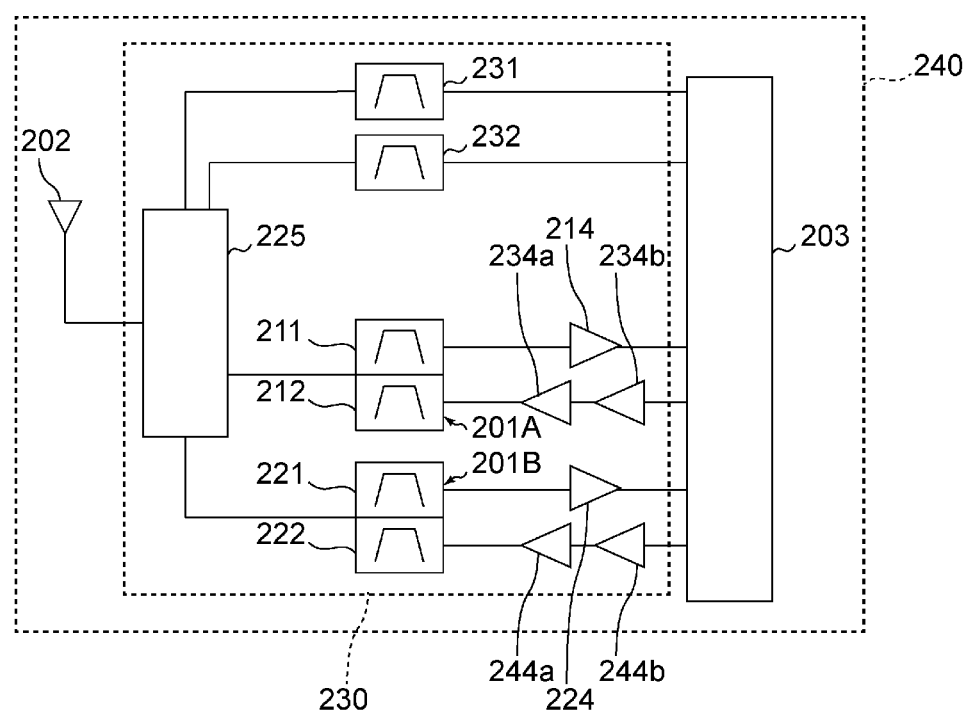
FIG. 9 is a schematic diagram of a communication apparatus including a high-frequency front-end circuit.

FIG. 9 is a schematic diagram of a communication apparatus and a high-frequency front-end circuit. FIG. 9 also illustrates components, such as an antenna element 202 and an RF signal integrated circuit (RFIC) 203, connected to a high-frequency front-end circuit 230. The high-frequency front-end circuit 230 and the RF signal integrated circuit 203 are included in a communication apparatus 240. The communication apparatus 240 may include a power source, a central processing unit (CPU), and a display, for example.

The high-frequency front-end circuit 230 includes a switch 225, duplexers 201A and 201B, filters 231 and 232, low-noise amplifier circuits 214 and 224, and power amplifier circuits 234a, 234b, 244a, and 244b. The high-frequency front-end circuit 230 and the communication apparatus 240 illustrated in FIG. 9 are examples of the high-frequency front-end circuit and the communication apparatus. The high-frequency front-end circuit and the communication apparatus are not limited to the configuration shown in FIG. 9.

The duplexer 201A includes filters 211 and 212. The duplexer 201B includes filters 221 and 222. The duplexers 201A and 201B are connected to the antenna element 202 via the switch 225. Elastic wave devices according to preferred embodiments of the present invention may be used for the duplexers 201A and 201B or may be used for the filters 211, 212, 221, and 222, for example.

The elastic wave devices according to preferred embodiments of the present invention may be used for multiplexers each including three or more filters, for example, triplexers each including three filters that share a common antenna terminal and hexaplexers including six filters share a common antenna terminal.

Examples of the elastic wave devices according to preferred embodiments of the present invention include elastic wave resonators, filters, duplexers, and multiplexers each including three or more filters. The configuration of each of the multiplexers is not limited to a configuration including both of a transmitting filter and a receiving filter. Each multiplexer may have a configuration including only a transmitting filter or only a receiving filter.

The switch 225 connects the antenna element 202 to at least one signal path corresponding to a predetermined band in response to a control signal from a controller (not illustrated), and may preferably include, for example, a single-pole double-throw (SPDT) switch. The at least one signal path connected to the antenna element 202 may be a plurality of signal paths. That is, the high-frequency front-end circuit 230 may support carrier aggregation (CA).

The low-noise amplifier circuit 214 is a reception amplifier circuit that amplifies a high-frequency signal (in this case, a high-frequency received signal) fed thereto via the antenna element 202, the switch 225, and the duplexer 201A and that feeds the amplified signal to the RF signal integrated circuit 203. The low-noise amplifier circuit 224 is a reception amplifier circuit that amplifies a high-frequency signal (in this case, a high-frequency received signal) fed thereto via the antenna element 202, the switch 225, and the duplexer 201B and that feeds the amplified signal to the RF signal integrated circuit 203.

Each of the power amplifier circuits 234a and 234b is a transmission amplifier circuit that amplifies a high-frequency signal supplied from the RF signal integrated circuit 203 (in this case, a high-frequency transmission signal) and that feeds the amplified signal to the antenna element 202 via the duplexers 201A and the switch 225. Each of the power amplifier circuits 244a and 244b is a transmission amplifier circuit that amplifies a high-frequency signal supplied from the RF signal integrated circuit 203 (in this case, a high-frequency transmission signal) and that feeds the amplified signal to the antenna element 202 via the duplexers 201B and the switch 225.

The RF signal integrated circuit 203 allows a high-frequency reception signal supplied from the antenna element 202 through a reception signal path to be subjected to signal processing, such as down-conversion, for example, and feeds a reception signal generated by the signal processing. The RF signal integrated circuit 203 allows a transmission signal fed thereto to be subjected to signal processing, such as up-conversion, for example, and feeds a high-frequency transmission signal generated by the signal processing to the power amplifier circuits 234a, 234b, 244a, and 244b. The RF signal integrated circuit 203 is, for example, an RFIC. The communication apparatus may include a baseband integrated circuit (BBIC). In this case, the BBIC processes a reception signal that has been processed by the RFIC. The BBIC processes a transmission signal and feeds the processed signal to the RFIC. The reception signal processed by the BBIC and the transmission signal to be processed with the BBIC are, for example, an image signal and an audio signal The high-frequency front-end circuit 230 may include duplexers according to a modification of the duplexers 201A and 201B, in place of the duplexers 201A and 201B.

The filters 231 and 232 in the communication apparatus 240 are connected between the RF signal integrated circuit 203 and the switch 225 without the low-noise amplifier circuit 214 or 224 or the power amplifier circuit 234a, 234b, 244a, or 244b. The filters 231 and 232 are also connected to the antenna element 202 via the switch 225, similarly to the duplexers 201A and 201B.

In the high-frequency front-end circuit 230 and the communication apparatus 240 having the configuration described above, the use of elastic wave devices according to preferred embodiments of the present invention as elastic wave resonators, filters, duplexers, multiplexers including three or more filters, and other suitable devices results in a more reliably improved quality factor.

The elastic wave devices, the high-frequency front-end circuits, and the communication apparatuses according to preferred embodiments of the present invention have been described as examples. The present invention include other preferred embodiments provided by combinations of the elements in the preferred embodiments and modifications described above, modifications obtained by various modifications of the preferred embodiments conceived by those skilled in the art without departing from the gist of the present invention, and various devices including the high-frequency front-end circuits and the communication apparatuses according to preferred embodiments of the present invention.

Preferred embodiments of the present invention may be widely used in communication devices, such as cellular phones, for example, as elastic wave resonators, filters, duplexers, multiplexers that can be used in multiband systems, front-end circuits, and communication apparatuses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric layer;
an interdigital transducer electrode disposed on the piezoelectric layer;
a high-acoustic-velocity member in which an acoustic velocity of a bulk wave that propagates through the high-acoustic-velocity member is higher than an acoustic velocity of an elastic wave that propagates through the piezoelectric layer; and
a low-acoustic-velocity film in which an acoustic velocity of a bulk wave that propagates through the low-acoustic-velocity film is lower than an acoustic velocity of an elastic wave that propagates through the piezoelectric layer, the low-acoustic-velocity film being located between the high-acoustic-velocity member and the piezoelectric layer; wherein
the piezoelectric layer is made of lithium tantalate;
the interdigital transducer electrode includes metal layers;
each of the metal layers includes an Al metal layer and a metal layer having a density higher than Al; and
expression 1 is satisfied:

$$301.74667 - 10.83029 \times T_{LT} - 3.52155 \times T_{ELE} + 0.10788 \times T_{LT}^2 + 0.01003 \times T_{ELE}^2 + 0.03989 \times T_{LT} \times T_{ELE} \geq 0 \quad \text{expression 1}$$

where λ represents a wavelength defined by an electrode finger pitch of the interdigital transducer electrode, $T_{LT}$ (%) represents a normalized film thickness of the piezoelectric layer and is obtained by normalizing a film thickness of the piezoelectric layer to the wavelength λ, and $T_{ELE}$ (%) represents a normalized film thickness of the interdigital transducer electrode in terms of Al and is obtained by normalizing a film thickness of the interdigital transducer electrode in terms of Al to the wavelength λ, the film thickness of the interdigital transducer electrode in terms of Al being calculated by dividing a sum of products of densities and thicknesses of the respective metal layers by a density of Al.

2. The elastic wave device according to claim 1, wherein expression 2 is satisfied:

$$236.606677 - 10.69079 \times T_{LT} - 3.52155 \times T_{ELE} + 0.10788 \times T_{LT}^2 + 0.01003 \times T_{ELE}^2 + 0.03989 \times T_{LT} \times L_{ELE} \geq 0 \quad \text{expression 2.}$$

3. The elastic wave device according to claim 1, wherein the normalized film thickness $T_{ELE}$ of the interdigital transducer electrode in terms of Al is about 14% or more and about 24% or less.

4. The elastic wave device according to claim 1, wherein the high-acoustic-velocity member is a supporting substrate.

5. The elastic wave device according to claim 1, further comprising:
a supporting substrate; wherein
the high-acoustic-velocity member is a high-acoustic-velocity film disposed between the supporting substrate and the low-acoustic-velocity film.

6. A high-frequency front-end circuit comprising:
the elastic wave device according to claim 1; and
a power amplifier.

7. The high-frequency front-end circuit according to claim 6, wherein expression 2 is satisfied:

$$236.606677-10.69079 \times T_{LT}-3.52155 \times T_{ELE}+0.10788 \times T_{LT}^2+0.01003 \times T_{ELE}^2+0.03989 \times T_{LT} \times T_{ELE} \geq 0 \quad \text{expression 2.}$$

8. The high-frequency front-end circuit according to claim 6, wherein the normalized film thickness $T_{ELE}$ of the interdigital transducer electrode in terms of Al is about 14% or more and about 24% or less.

9. The high-frequency front-end circuit according to claim 6, wherein the high-acoustic-velocity member is a supporting substrate.

10. The high-frequency front-end circuit according to claim 6, further comprising:
 a supporting substrate; wherein
 the high-acoustic-velocity member is a high-acoustic-velocity film disposed between the supporting substrate and the low-acoustic-velocity film.

11. A communication apparatus, comprising:
 the high-frequency front-end circuit according to claim 6; and
 an RF signal processing circuit.

12. The communication apparatus according to claim 11, wherein expression 2 is satisfied:

$$236.606677-10.69079 \times T_{LT}-3.52155 \times T_{ELE}+0.10788 \times T_{LT}^2+0.01003 \times T_{ELE}^2+0.03989 \times T_{LT} \times T_{ELE} \geq 0 \quad \text{expression 2.}$$

13. The communication apparatus according to claim 11, wherein the normalized film thickness $T_{ELE}$ of the interdigital transducer electrode in terms of Al is about 14% or more and about 24% or less.

14. The communication apparatus according to claim 11, wherein the high-acoustic-velocity member is a supporting substrate.

15. The communication apparatus according to claim 11, further comprising:
 a supporting substrate; wherein
 the high-acoustic-velocity member is a high-acoustic-velocity film disposed between the supporting substrate and the low-acoustic-velocity film.

* * * * *